US009679654B2

(12) United States Patent
Rumberg et al.

(10) Patent No.: US 9,679,654 B2
(45) Date of Patent: *Jun. 13, 2017

(54) CONTINUOUS-TIME FLOATING GATE MEMORY CELL PROGRAMMING

(71) Applicant: West Virginia University, Morgantown, WV (US)

(72) Inventors: Brandon David Rumberg, Morgantown, WV (US); David W. Graham, Morgantown, WV (US)

(73) Assignee: WEST VIRGINIA UNIVERSITY, Morgantown, WV (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/940,683

(22) Filed: Nov. 13, 2015

(65) Prior Publication Data

US 2016/0071600 A1   Mar. 10, 2016

Related U.S. Application Data

(63) Continuation of application No. 13/838,575, filed on Mar. 15, 2013, now Pat. No. 9,218,883.

(51) Int. Cl.
G11C 16/10 (2006.01)
G11C 16/26 (2006.01)
G11C 16/06 (2006.01)
G11C 16/30 (2006.01)

(52) U.S. Cl.
CPC ............. *G11C 16/10* (2013.01); *G11C 16/06* (2013.01); *G11C 16/26* (2013.01); *G11C 16/30* (2013.01)

(58) Field of Classification Search
CPC .................................. G11C 16/26; G11C 16/10
USPC ........................................ 365/185.21, 185.24
See application file for complete search history.

(56) References Cited

U.S. PATENT DOCUMENTS

| 5,748,534 | A | * | 5/1998 | Dunlap | ............... | G11C 11/5642 |
| | | | | | | 327/54 |
| 5,751,635 | A | * | 5/1998 | Wong | ................... | G11C 11/5621 |
| | | | | | | 327/93 |
| 6,111,791 | A | * | 8/2000 | Ghilardelli | ............. | G11C 5/145 |
| | | | | | | 365/185.21 |
| 2002/0089024 | A1 | * | 7/2002 | Iwata | ..................... | B82Y 10/00 |
| | | | | | | 257/421 |
| 2006/0023531 | A1 | * | 2/2006 | Crippa | ................ | G11C 11/5642 |
| | | | | | | 365/203 |
| 2006/0158265 | A1 | * | 7/2006 | Sumita | ...................... | G06F 1/10 |
| | | | | | | 331/16 |

(Continued)

*Primary Examiner* — Michael Tran

(74) *Attorney, Agent, or Firm* — Buckley, Maschoff & Talwalkar LLC

(57) ABSTRACT

Aspects of a continuous-time memory cell circuit are described. In various embodiments, the memory cell circuit may comprise a memory cell, a current source coupled to the memory cell, and circuitry for programming the memory cell at an adaptive rate, based on a target voltage for programming, using a feedback loop between a gate terminal of the memory cell and a reference control input. Based on the circuitry for programming, the memory cell may be programmed according to various voltage and/or current references, by linear injection and/or tunneling mechanisms. According to various aspects, the circuitry for programming drives a memory cell to converge to a voltage target for programming within a short period of time and to a suitable level of accuracy.

10 Claims, 10 Drawing Sheets

(56) References Cited

U.S. PATENT DOCUMENTS

| | | | |
|---|---|---|---|
| 2009/0161434 A1* | 6/2009 | Pan | G11C 16/30 365/185.12 |
| 2009/0180326 A1* | 7/2009 | Yamazaki | G11C 11/5621 365/185.18 |
| 2011/0310678 A1* | 12/2011 | Lin | G11C 7/062 365/189.07 |
| 2012/0300567 A1* | 11/2012 | Fort | G11C 7/067 365/207 |
| 2013/0069623 A1* | 3/2013 | Fort | G11C 7/062 324/76.11 |

* cited by examiner

CONTINUOUS-TIME FLOATING GATE MEMORY CELL PROGRAMMING

CROSS-REFERENCE TO RELATED APPLICATIONS

The present application is a continuation of U.S. patent application Ser. No. 13/838,575 entitled "CONTINUOUS-TIME FLOATING GATE MEMORY CELL PROGRAMMING" and filed Mar. 15, 2013 (issued as U.S. Pat. No. 9,218,883). The entire content of that application is incorporated herein by reference.

GOVERNMENT LICENSE RIGHTS

This invention was made with government support under contract W911 NF-10-2-0109, awarded by the United States Army Research Laboratory. The government has certain rights in the invention.

BACKGROUND

As one choice for nonvolatile analog memory in complementary metal oxide semiconductor (CMOS) processes, floating gate transistors are often selected. Floating gate transistors may be used to design analog memory arrays of relatively large scale. In addition to their role as nonvolatile memory elements in large memory arrays, floating gate transistors are used for programmable voltage/current references, precision analog device matching, and adaptive/learning circuits. Some memory cells based upon floating gate transistors are used in battery powered, and generally resource-constrained, applications. For resource-constrained applications, any overhead circuitry for memory cell programming should be simple, preferably, while also providing a means for quick and accurate programming.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1A:
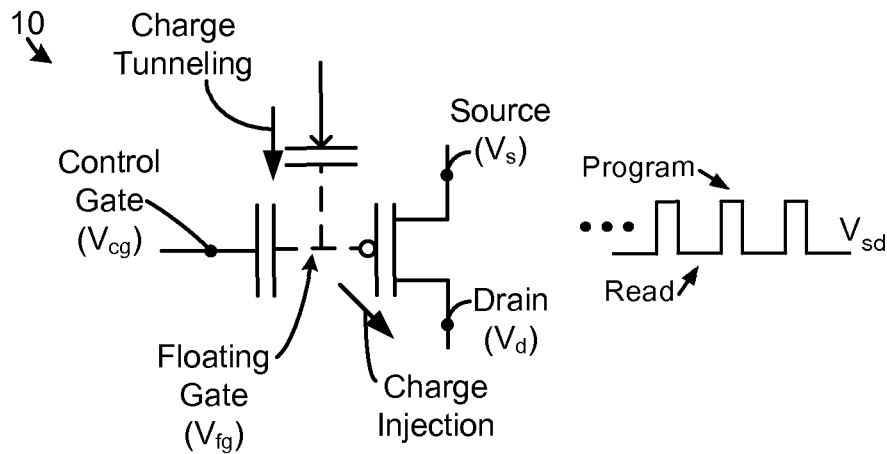
FIG. 1A illustrates an example floating gate transistor, as it relates to certain aspects of the embodiments described herein.

Due to their ability to provide analog biases, floating gate transistors are sometimes relied upon in programmable analog systems such as filter banks, classifiers, and field-programmable analog arrays. In these systems, circuit parameters (e.g., corner frequencies) are controlled by an amount of charge on a floating gate. As a result, system performance depends strongly on the accuracy of programming charge on the floating gate. Certain techniques have achieved high accuracy, although with various tradeoffs in circuit complexity, accuracy, and speed.

Generally, two phenomena are typically used to program floating gate transistors: hot electron injection and Fowler-Nordheim tunneling. Injection occurs when a large source-to-drain potential (e.g., >3.5V for a 0.35 µm CMOS process) is applied to a floating gate transistor, causing high energy carriers to impact-ionize at the drain. A fraction of the resulting ionized electrons disperse with enough energy to overcome the oxide barrier between the floating gate and the substrate of the transistor and are injected onto the floating gate. Tunneling, on the other hand, requires relatively higher voltages (e.g., >8V for a 0.35 µm CMOS process). In order to avoid write disturbs during tunneling, unselected array elements are generally disconnected from tunneling voltages using high-voltage switches, or the floating gates of the unselected array elements are raised to a sufficient voltage so that tunneling does not occur. Due to this difficulty in isolating tunneling within an array, tunneling is typically used for global erasure in analog memory arrays, while injection is used to write to individual elements.

The embodiments described herein for continuous-time floating gate memory cell programming include a floating gate memory cell (or array of memory cells) accompanied by certain circuitry for programming. Based on the circuitry for programming, the memory cell may be programmed according to various voltage and/or current references, by linear injection and/or tunneling mechanisms. According to various aspects described herein, the circuitry for programming drives a memory cell to converge to a target within a short period of time and to a suitable level of accuracy.

As further described below, feedback is provided for programming a floating gate transistor by linearized injection and/or tunneling mechanisms. This is accomplished according to various embodiments and arrangements of circuitry for programming. Among the embodiments described herein, the circuitry for programming offers flexible control over injection and tunneling rates by modification of voltage and/or current based on feedback. The continuous-time programming techniques described herein are accomplished by relying upon feedback to stop programming when a memory cell reaches a target value for programming.

In order to linearize characteristics of injection and tunneling, programming circuits may use feedback to maintain a constant floating gate voltage, as further discussed below in connection with certain embodiments. It is noted that, in some conventional techniques, a rate of programming is maintained until a target is reached, then programming is stopped. Such a constant rate programming technique faces a severe tradeoff between programming speed and accuracy. According to aspects of the embodiments described herein, currents or voltages for programming are varied over time to reduce a rate of programming as a target level is approached, resulting in a better tradeoff between programming speed and accuracy.

Turning now to the drawings, a general description of exemplary embodiments are described, with a discussion of the operation of the same.

FIG. 1A illustrates an example floating gate transistor 10, as it relates to certain aspects of the embodiments described herein. Generally, the floating gate transistor 10 is a metal oxide semiconductor field effect transistor (MOSFET) having a floating gate. In the floating gate transistor 10, a control gate terminal couples capacitively to the floating gate of the transistor 10. In the floating gate transistor 10, an amount of charge on the floating gate (FG) can be modified using Fowler-Nordheim tunneling and hot-electron injection mechanisms. This change in charge on the FG creates a programmable and nonvolatile threshold/voltage shift from the perspective of the control gate. In other words, for a constant voltage applied to the control gate, the effective voltage seen at or applied to the FG varies as the amount of charge on the FG changes.

In order to modify the charge on the FG (i.e., "program" it), relatively high voltages may be applied to one or more of terminals of the floating gate transistor 10 (i.e., the source, gate, and drain terminals). Generally, during charge injection, charge from the FG is passed to the drain terminal and, during charge tunneling, charge is passed to the FG. It is noted that charge on the FG can be programmed to a desired amount using either pulsed or continuous methods. In pulsed programming, source to drain potential, for example, is alternately pulsed to a high differential for injection, and then placed at a nominal value to measure charge injected on the FG, as illustrated in FIG. 1A.

One advantage of pulsed programming techniques, in terms of accuracy, is that the amount of charge injected to the FG is measured during a nominal or run-time state, with no high voltages being applied to a memory cell. However, pulsed programming is generally slow due to the amount of time spent reading. Methods to increase programming speed rely on precise knowledge of characteristics of each FG, so that each programming pulse can move more aggressively towards a target, adding complexity. Additionally, pulsed programming techniques require high-precision pulse timing, for example, and possibly wide-range current measurements. These high-precision and wide-rage timing and measurement aspects complicate the use of FG memory cells in simple, resource-constrained, systems.

Figure 1B:
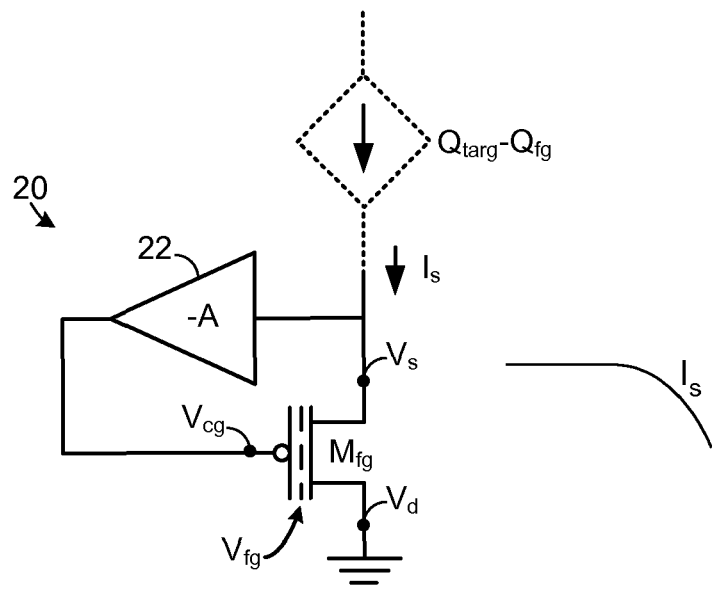
FIG. 1B illustrates an example circuit arrangement for continuous or linear programming of a floating gate transistor, as it relates to certain aspects of the embodiments described herein.

In contrast to pulsed methods of programming, continuous methods apply a programming voltage continuously, and use feedback to drive the FG to converge to a target voltage. That is, feedback is relied upon to adjust—and eventually shut off—charge injection or tunneling as a target charge on the FG is approached. FIG. 1B illustrates a circuit arrangement 20 for continuous or linear programming of a floating gate transistor $M_{fg}$, as it relates to certain aspects of the embodiments described herein.

In FIG. 1B, the circuit arrangement 20 includes a floating gate transistor $M_{fg}$ and an amplifier 22. Feedback, representative of the source voltage $V_s$, is used as a reference control input to the amplifier 22, which holds the effective voltage at the FG constant to linearize injection. As illustrated in the example of FIG. 1B, as the charge on the FG converges to the target, the source current $I_s$ trails off in magnitude due to the convergence, based on the feedback. It is noted that, as the charge $Q_{fg}$ on the FG converges to a target amount of charge $Q_{targ}$, the source current $I_s$ will trail off in magnitude as the effective voltage at the FG varies. In certain aspects, continuous programming may be faster and requires less circuitry for programming, as compared to pulsed programming. However, in some circumstances, the faster rate of programming achieved in the circuit arrangement 20 may be associated with a tradeoff in programming accuracy.

Figure 2A:
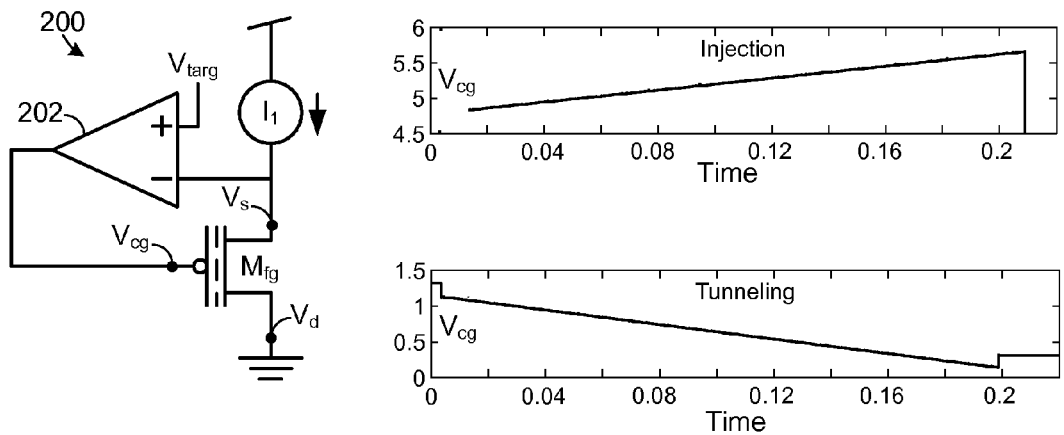
FIG. 2A illustrates another example circuit arrangement for continuous or linear programming of a floating gate transistor, as it relates to certain aspects of the embodiments described herein.

FIG. 2A illustrates another example circuit arrangement 200 for continuous or linear programming of a floating gate transistor $M_{fg}$, as it relates to certain aspects of the embodiments described herein. In FIG. 2A, the circuit arrangement 200 includes a floating gate transistor $M_{fg}$, a current source $I_1$, and an operational amplifier 202. Feedback, representative of the source voltage $V_s$, is used as a reference control input to the operational amplifier 220, which holds the effective voltage at the FG constant to linearize the programming characteristics.

As illustrated at the injection and tunneling gate voltage diagrams in FIG. 2A, the control gate voltage $V_{cg}$ of the floating gate transistor $M_{fg}$ changes over time. The change is due to the feedback, which maintains the effective voltage at the FG constant by adjusting the control gate voltage to compensate for the charge that has been injected. For example, as the charge $Q_{fg}$ on the FG of the transistor $M_{fg}$ changes over time, a threshold/voltage shift in the transistor $M_{fg}$ will lead to a change in the source voltage $V_s$ (which is also attributed to the change in current $I_s$). In turn, the change in difference between $V_s$ and $V_{targ}$ is evaluated by the operational amplifier 202, and the voltage $V_{cg}$ on the control gate is changed linearly over time by the operational amplifier 202, as illustrated at the injection and tunneling gate voltage diagrams in FIG. 2A. This mechanism of linear change in voltage may be relied upon for either injection or tunneling of charge to the FG of the transistor $M_{fg}$.

Figure 2B:
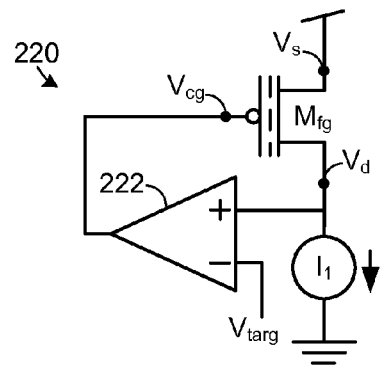
FIG. 2B illustrates another example circuit arrangement for continuous or linear programming of a floating gate transistor, as it relates to certain aspects of the embodiments described herein.

FIG. 2B illustrates another example circuit arrangement 220 for continuous or linear programming of a floating gate transistor $M_{fg}$, as it relates to certain aspects of the embodiments described herein. In FIG. 2B, the circuit arrangement 220 includes a floating gate transistor $M_{fg}$, a current source $I_1$, and an operational amplifier 222. As compared to the circuit arrangement 200 of FIG. 2A, the operational amplifier 222 in FIG. 2B is coupled between the drain and gate terminals of the transistor $M_{fg}$ rather than between the source and gate terminals. In this case, feedback representative of the drain voltage $V_d$ is used as a reference control input to the operational amplifier 222, which holds the effective voltage at the FG constant to linearize the programming characteristics.

Using the feedback to $V_{cg}$, as illustrated in the circuit arrangements 200 and 220 in FIGS. 2A and 2B, with the source and drain terminals of the floating gate transistor $M_{fg}$ kept constant due to the feedback, a rate of injection and/or tunneling can be held constant. In both the circuit arrangements 200 and 220, $V_{cg}$ ramps linearly up during injection or down during tunneling (see FIG. 2A), to compensate for a change in charge on the FG over time. The value of $V_{cg}$ thus provides a representative measure of charge stored on the FG of the transistor $M_{fg}$. It is noted that, because of high gain around the feedback loop of the circuit arrangement 220 in FIG. 2B, stability problems may be encountered. Thus, certain embodiments described herein are modeled after the feedback arrangement in FIG. 2A.

Figure 3A:
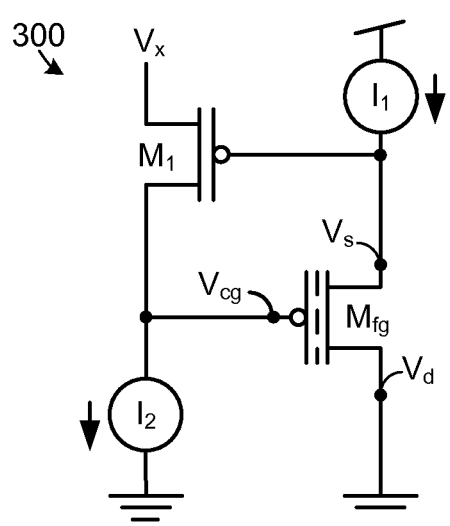
FIG. 3A illustrates a memory cell circuit arrangement for continuous-time floating gate memory cell programming, according to an example embodiment.

FIG. 3A illustrates a memory cell circuit arrangement 300 for continuous-time floating gate memory cell programming, according to an example embodiment. To achieve certain characteristics of the circuit arrangement 200 in FIG. 2A, but reduce size and complexity, the circuit arrangement 300 in FIG. 3A was developed. The circuit arrangement 300 includes a floating gate transistor memory cell $M_{fg}$ having a source terminal, a drain terminal, and a gate terminal, a first current source $I_1$ coupled to the source terminal of the memory cell $M_{fg}$, a second current source $I_2$ coupled to the gate terminal of the memory cell $M_{fg}$, and a bias circuit (i.e., transistor $M_1$) coupled between a bias voltage $V_x$ and the gate terminal of the memory cell $M_{fg}$. The current sources $I_1$ and $I_2$ may be embodied by a single transistor or, in various embodiments, current mirrors and/or other circuitry, for example. Although the circuit arrangement 300 in FIG. 3A makes use of a P-channel transistor for the memory cell $M_{fg}$, it is noted that embodiments may incorporate N-channel memory cell transistors. Also, in the various embodiments described herein, the well of a floating gate memory cell transistor $M_{fg}$ may be shorted to a supply voltage or a source terminal of the floating gate transistor.

In the circuit arrangement 300, $M_1$ replaces the operational amplifier 202 in FIG. 2A. Feedback in the circuit arrangement 300 results in an adjustment to the voltage $V_{cg}$, to maintain $V_s$ at a fixed voltage during programming. Equilibrium of the circuit arrangement 300 depends on the voltage $V_x$ and the currents $I_1$ and $I_2$. Thus, independent control of the source current and drain-to-source potential (two main injection parameters) may be maintained with the circuit arrangement 300. Particularly, three control terminals are available for modifying injection parameters: the voltage $V_x$ and the currents $I_1$ and $I_2$.

Figure 3B:
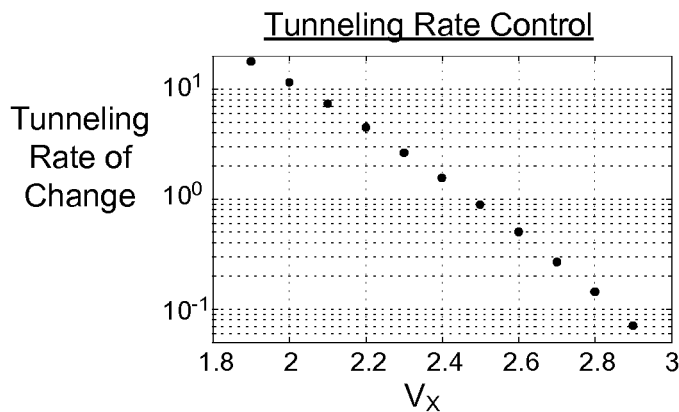
FIG. 3B illustrates an example rate of change of tunneling as a function a control parameter in the circuit arrangement of FIG. 3A, according to certain aspects of an example embodiment.

FIG. 3B illustrates an example rate of change of tunneling as a function of a control parameter. Particularly, in FIG. 3B, data points for a normalized rate of change of tunneling vs. control voltage $V_x$ in the circuit arrangement 300 of FIG. 3A is illustrated. The representative data points were captured from a floating gate transistor fabricated in a 0.35 μm standard CMOS process, with dimensions $$\frac{W}{L} = \frac{1.6\ \mu m}{0.6\ \mu m}$$

and gate capacitance of $C_g$=60 fF. FIG. 3B illustrates tunneling current dependence on $V_x$, while all other control parameters were fixed over time.

Figure 3C:
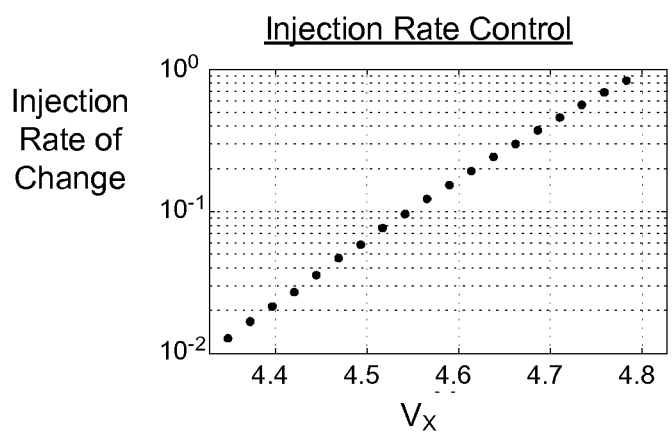
FIG. 3C illustrates an example rate of change of injection as a function a control parameter in the circuit arrangement of FIG. 3A, according to certain aspects of an example embodiment.

FIG. 3C illustrates an example rate of change of injection as a function of a control parameter. Particularly, in FIG. 3C, data points for a normalized rate of change of injection vs. control voltage $V_x$ in the circuit arrangement 300 of FIG. 3A is illustrated. Again, the representative data points were captured from a floating gate transistor fabricated in a 0.35 μm standard CMOS process with the same dimensions and gate capacitance as in FIG. 3B. FIG. 3C illustrates injection current dependence on $V_x$, while all other control parameters were fixed over time.

Figure 3D:
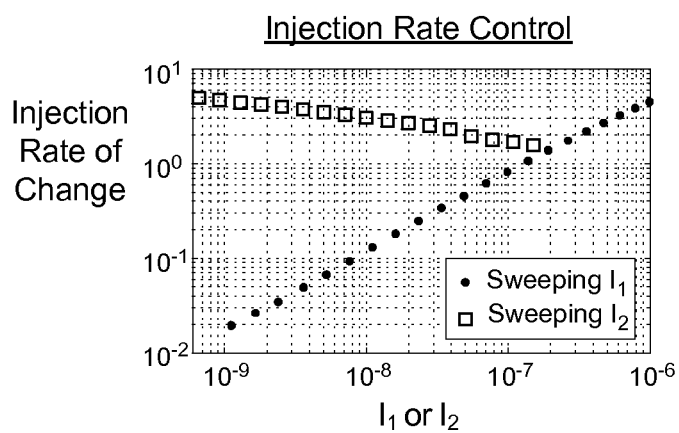
FIG. 3D illustrates an example rate of change of injection as a function of other control parameters in the circuit arrangement of FIG. 3A, according to certain aspects of an example embodiment.

FIG. 3D illustrates an example rate of change of injection as a function of other control parameters in the circuit arrangement of FIG. 3A. Particularly, in FIG. 3D, data points for a normalized rate of change of injection vs. control currents $I_1$ and $I_2$ in the circuit arrangement 300 of FIG. 3A is illustrated.

It should be appreciated from the data illustrated in FIGS. 3B-3D that the control parameters $I_1$, $I_2$, and $V_x$ may be relied upon to change the rate of injection and/or tunneling. Further, the data demonstrates the ability to adjust programming rate of a memory cell over a large range using either voltage or current control inputs. For example, circuitry for programming a memory cell may adjust the bias voltage $V_x$ or one of the bias currents $I_1$ or $I_2$, as described below among FIGS. 4A, 5A, 6, and 7B. Additionally, the relatively weak programming dependence on $I_2$, at approximately an inverse fifth root dependence, makes $I_2$ appropriate for fine programming rate adjustments.

Figure 4A:
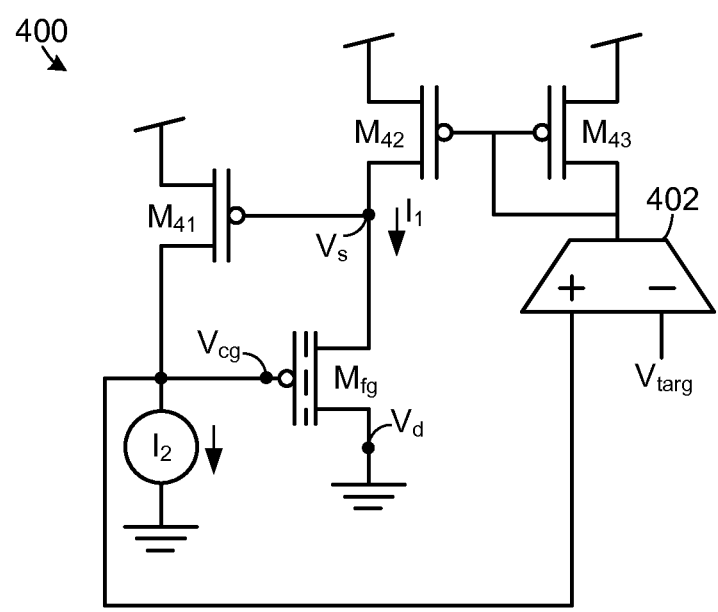
FIG. 4A illustrates a memory cell circuit arrangement for continuous-time floating gate memory cell programming, according to an example embodiment.

FIG. 4A illustrates a memory cell circuit arrangement 400 for continuous-time floating gate memory cell programming, according to an example embodiment. In certain aspects, the circuit arrangement 400 includes extended and/or varied circuit elements as compared to the circuit arrangement 300 of FIG. 3A. The circuit arrangement 400 includes a floating gate transistor memory cell $M_{fg}$ having a source terminal, a drain terminal, and a gate terminal, a current source $I_2$ coupled to the gate terminal of the memory cell $M_{fg}$, and a bias circuit (i.e., transistor $M_{41}$) coupled between a bias voltage $V_x$ and the gate terminal of the memory cell $M_{fg}$. The current source $I_2$ may be embodied by a single transistor or, in various embodiments, current mirrors and/or other circuitry, for example.

The circuit arrangement 400 also includes a current mirror including transistors $M_{42}$ and $M_{43}$ and an operational transconductance amplifier (OTA) 402. The OTA 402 includes an output terminal and a pair of differential input terminals. The output of the current mirror $M_{42}$-$M_{43}$ is coupled to the source terminal of the memory cell $M_{fg}$, and a reference input of the current mirror (i.e., drain terminal of $M_{43}$) is coupled to the output of the OTA 402. Further, as illustrated, the non-inverting input of the OTA 402 is coupled to the gate terminal of the memory cell $M_{fg}$, and the inverting input of the OTA 402 is coupled to a target voltage $V_{targ}$ for programming the memory cell $M_{fg}$.

In the circuit arrangement 400, the current $I_1$ is relied upon as a control parameter for programming. The OTA 402 converts the difference between $V_{cg}$ and the target voltage $V_{targ}$ into a current output. This current output is rectified by the current mirror $M_{42}$-$M_{43}$ and is driven into the source terminal of the memory cell $M_{fg}$. As the target charge on the FG of the memory cell $M_{fg}$ is approached, the rate of injection is reduced by the feedback provided by the coupling of $V_{cg}$ to the OTA 402. The injection is eventually stopped, by a continued reduction of $I_1$.

Figure 4B:
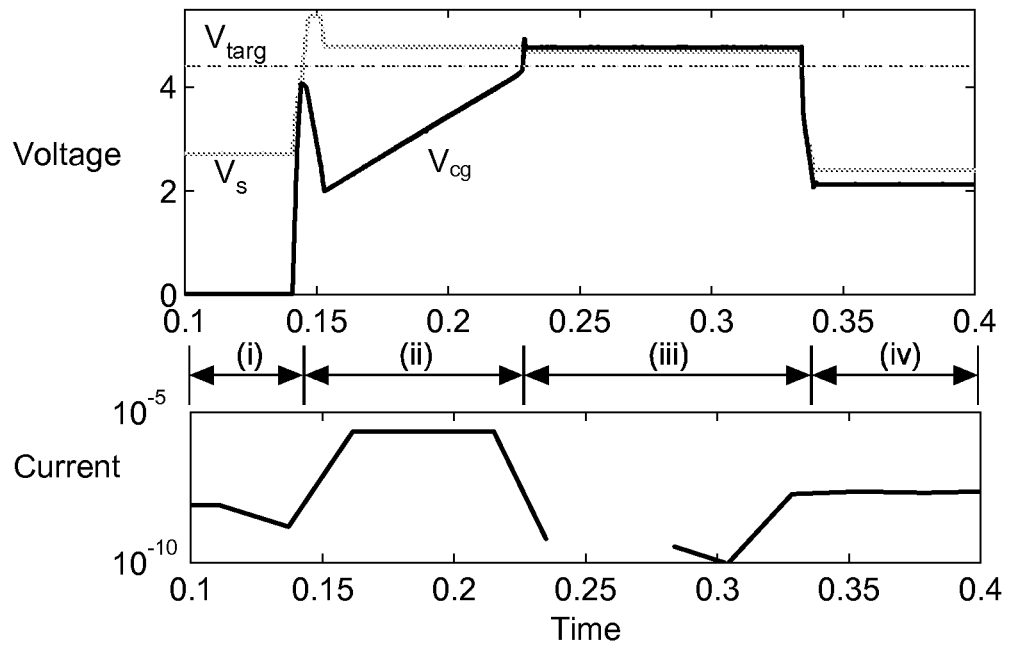
FIG. 4B illustrates an example representation of terminal voltages over time during a programming process of the circuit arrangement 400 of FIG. 4A, according to certain aspects of an example embodiment.

FIG. 4B illustrates an example representation of terminal voltages over time during a programming process of the circuit arrangement 400 of FIG. 4A. During the pre-injection interval (i), the source terminal voltage $V_s$ of the memory cell $M_{fg}$ is at a nominal operation value of about 3V, and the FG of the memory cell $M_{fg}$ has been tunneled to the point that $V_{cg}$ is at about 0V. When the injection interval (ii) starts, the source terminal voltage $V_s$ is ramped up to about 5.4V, which pulls $V_{cg}$ up, and there is a short time during which the capacitance at the node of $V_{cg}$ is discharged through $I_2$. In the example illustrated, the relatively significant duration of this discharge time may be attributed to parasitic capacitance of in the testing setup, and may be expected to be smaller in another reduction of the circuit arrangement 400 into practice. Once $V_{cg}$ is discharged, linear injection is observed. As $V_{cg}$ approaches the target, $I_1$ is reduced (see the bottom pane of FIG. 4B). Once $V_{cg}$ reaches the target, $I_1$ becomes zero. At the end of the interval (iii), the feedback circuitry has stopped operating, and $I_1$ is shut off. As a result, $V_{cg}$ is pulled high. Here, the target programming level for the memory cell $M_{fg}$ has been reached.

For the read mode interval (iv), the supply is ramped down to a run-time level, and the memory cell $M_{fg}$ is configured as a voltage reference. For example, the feedback circuitry (i.e., the OTA 402) is removed from the loop, a constant voltage is applied to the gate of $M_{42}$ (a constant current $I_1$ is applied), and a voltage output of the memory cell $M_{fg}$ is identified at $V_{cg}$. It is noted that $I_2$ may be maintained as a constant over the various intervals illustrated in FIG. 4B. It should also be appreciated that various read configurations may be relied upon, including alternative means of removing the memory cell $M_{fg}$ from the other elements in the circuit arrangement 400, and placing it into a separate circuit for a current output read, for example.

Figure 4C:
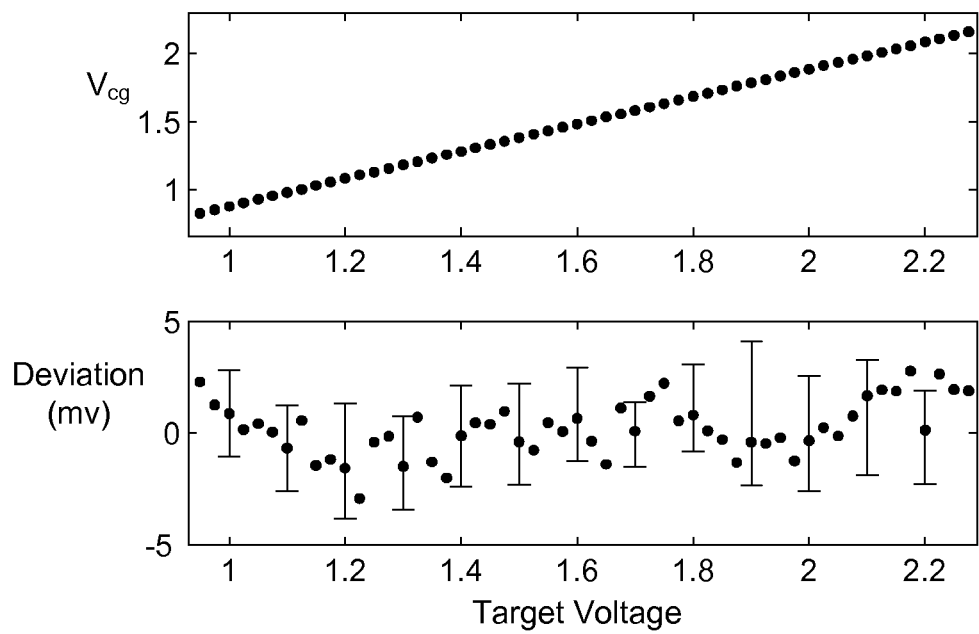
FIG. 4C illustrates example data points representative of aspects of accuracy in programming for the circuit arrangement 400 of FIG. 4A.

FIG. 4C illustrates example data points representative of aspects of accuracy in programming for the circuit arrangement 400 of FIG. 4A. FIG. 4C illustrates the results of performance experiments on the circuit arrangement 400 including the memory cell $M_{fg}$ and programming circuitry combination. In FIG. 4C, the y-axis is representative of target voltages for programming, measured with reference to voltage rail for programming. As shown in the top pane, the memory cell $M_{fg}$ was programmed to linearly spaced values of $V_{targ}$, and the value of $V_{cg}$ was measured in read mode, during which the OTA 402 was disconnected and a fixed current was applied for $I_1$. It can be seen that the memory cell $M_{fg}$ exhibits a linear relationship between $V_{targ}$ and read mode $V_{cg}$.

In the bottom pane of FIG. 4C, any straight-line deviation from the linear relationship between $V_{targ}$ and read-mode $V_{cg}$ is illustrated. For every fourth data point, the memory cell $M_{fg}$ was programmed 100 times, to verify repeatability. From these repeatability measurements, the error bars in the bottom pane of FIG. 4C were determined. The error bars show maximum and minimum values of deviation. Over about a 1.36V range of $V_{targ}$ programming, the maximum deviation identified was about 4.2 mV, yielding an accuracy of over 8-bits.

Figure 5A:
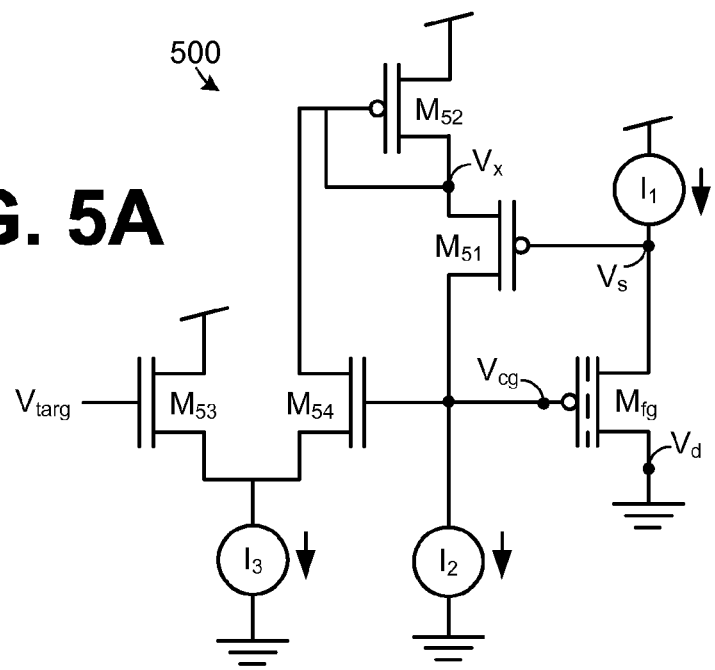
FIG. 5A illustrates a memory cell circuit arrangement for continuous-time floating gate memory cell programming, according to an example embodiment.

FIG. 5A illustrates a memory cell circuit arrangement 500 for continuous-time floating gate memory cell programming, according to an example embodiment. In certain aspects, the circuit arrangement 500 includes extended and/or varied circuit elements as compared to the circuit arrangement 300 of FIG. 3A. The circuit arrangement 500 includes a floating gate transistor memory cell $M_{fg}$ having a source terminal, a drain terminal, and a gate terminal, a first current source $I_1$ coupled to the source terminal of the memory cell $M_{fg}$, a second current source $I_2$ coupled to the gate terminal of the memory cell $M_{fg}$, and a transistor $M_{51}$ coupled to the gate terminal of the memory cell $M_{fg}$. The second current source $I_2$ may be embodied by a single transistor or, in various embodiments, current mirrors and/or other circuitry, for example.

The circuit arrangement 500 also includes a programming control circuit that adjusts the bias voltage $V_x$ based on a target voltage for programming the memory cell. As illustrated in FIG. 5, the bias control circuit comprises a differential amplifier including transistors $M_{53}$ and $M_{54}$, a current source $I_3$, and a voltage follower transistor $M_{52}$ that sets $V_x$ for the circuit arrangement 500.

The differential amplifier $M_{53}$-$M_{54}$ includes a pair of differential input terminals. One input of differential amplifier is coupled to the gate terminal of the memory cell $M_{fg}$, and another input of the differential amplifier is coupled to the target voltage for programming $V_{targ}$. Further, as a coupling of an output reference of the differential amplifier, the transistor $M_{54}$ is coupled to the gate terminal of the voltage follower transistor $M_{52}$, which sets the bias voltage $V_x$ for programming the memory cell $M_{fg}$.

In the circuit arrangement 500, $V_x$ is relied upon as a control parameter for programming. The differential amplifier seeks to balance the current through the transistor $M_{53}$ with that of $M_{54}$, in view of any difference in between the voltage $V_{cg}$ at the gate terminal of the memory cell $M_{fg}$ and the target voltage $V_{targ}$. The transistor $M_{54}$ of the differential amplifier is coupled to the gate terminal of the voltage follower transistor $M_{52}$, which sets the bias voltage $V_x$ for programming the memory cell $M_{fg}$. Thus, the memory cell $M_{fg}$ may be programmed, in part, according to an adjustment of a potential of the bias voltage via the voltage follower transistor $M_{52}$. During programming, the circuit arrangement 500 drives $V_{cg}$ to converge to $V_{targ}$ by reducing $V_x$ (and thus reducing $V_s$) as the target is approached. As a target charge on the FG of the memory cell $M_{fg}$ is approached, the rate of injection is reduced by the feedback provided by the coupling of $V_{cg}$ to the differential amplifier.

Figure 5B:
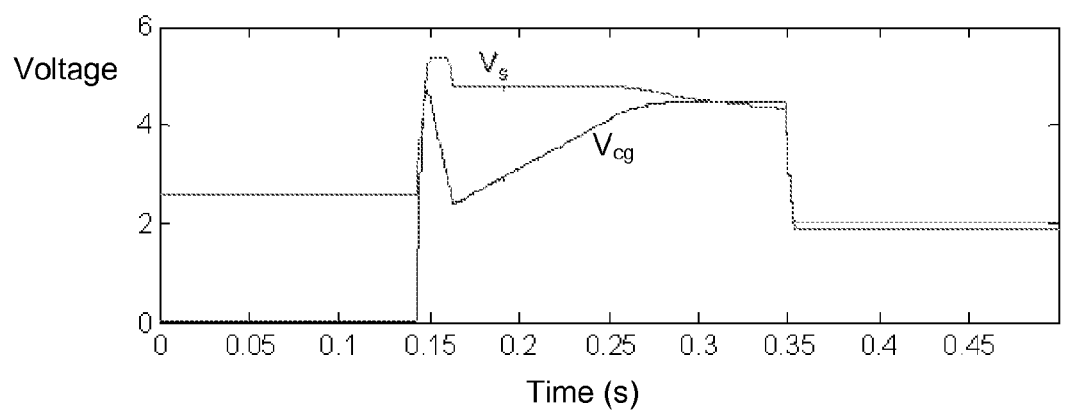
FIG. 5B illustrates an example representation of terminal voltages over time during a programming process of the circuit arrangement of FIG. 5A.

FIG. 5B illustrates an example representation of terminal voltages over time during a programming process of the circuit arrangement 500 of FIG. 5A. In FIG. 5B, terminal voltages for $V_s$ and $V_{cg}$ are illustrated over time and during a phase of programming. The results are similar to that illustrated in FIG. 4B, although it should be appreciated that the control parameter applied for programming in FIG. 5B is different than that in FIG. 4B.

Figure 6:
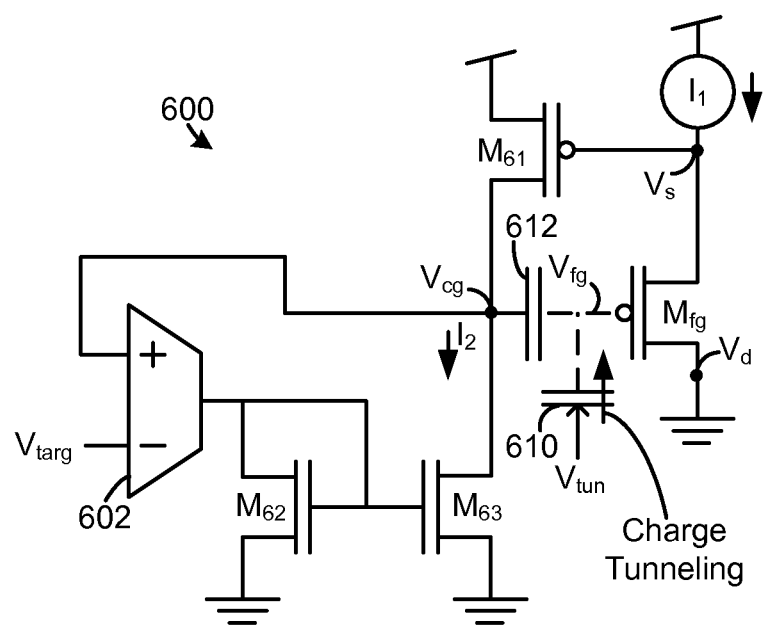
FIG. 6 illustrates a memory cell circuit arrangement for continuous-time floating gate memory cell programming by tunneling, according to an example embodiment.

FIG. 6 illustrates a memory cell circuit arrangement 600 for continuous-time floating gate memory cell programming by tunneling, according to an example embodiment. In certain aspects, the circuit arrangement 600 includes extended and/or varied circuit elements as compared to the circuit arrangement 300 of FIG. 3A. The circuit arrangement 600 includes a floating gate transistor memory cell $M_{fg}$ having a source terminal, a drain terminal, and a gate terminal, a first current source $I_1$ coupled to the source terminal of the memory cell $M_{fg}$, a transistor $M_{61}$ coupled to the gate terminal of the memory cell $M_{fg}$, and capacitances 610 and 612. The first current source $I_1$ may be embodied by a single transistor or, in various embodiments, current mirrors and/or other circuitry, for example.

The circuit arrangement 600 also includes a tunneling control circuit that adjusts the voltage $V_{cg}$ at the gate terminal of the memory cell $M_{fg}$, based on a target voltage $V_{targ}$ for programming the memory cell $M_{fg}$. As illustrated in FIG. 6, the tunneling control circuit comprises an OTA 602 and a current mirror including transistors $M_{62}$ and $M_{63}$. The OTA 602 includes a pair of inverting and non-inverting differential input terminals. The non-inverting input terminal is coupled to $V_{cg}$ at the gate terminal of the memory cell $M_{fg}$, and the inverting terminal is coupled to the target voltage $V_{targ}$ for programming the memory cell $M_{fg}$.

In the circuit arrangement 600, to write a value to the FG of the memory cell $M_{fg}$, a large positive voltage is applied at $V_{tun}$ of the capacitance 610. In turn, electrons tunnel off the $V_{fg}$ node. The feedback path of the memory cell $M_{fg}$ through $M_{61}$ causes the voltage at $V_{cg}$ to drop, in response to the increasingly positively-charged $V_{fg}$ node. As $V_{cg}$ approaches $V_{targ}$, the current $I_2$ is reduced so that $V_s$ increases, and $V_{fg}$ also increases. This reduces the tunneling rate by reducing the voltage across the tunneling oxide of the memory cell $M_{fg}$. In addition to being an example of adaptive-rate tunneling, the circuit arrangement 600 is also an example of how a programming rate of a memory cell can be adapted by varying the current $I_2$.

Figure 7A:
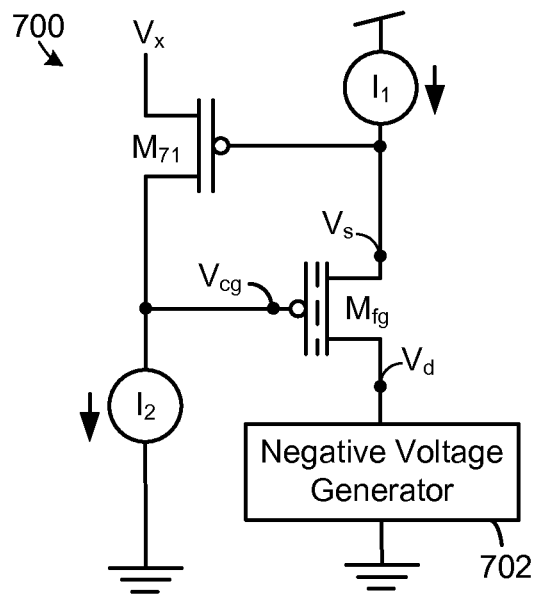
FIG. 7A illustrates a memory cell circuit arrangement for floating gate memory cell programming by negative voltage control, according to an example embodiment.

FIG. 7A illustrates a memory cell circuit arrangement 700 for floating gate memory cell programming by negative voltage control, according to an example embodiment. Here, it is noted that certain embodiments described above rely upon the generation of a relatively high drain-to-source potential, for injection, by raising voltages above nominal levels. In connection with FIG. 7A, it is noted that additional or alternative mechanisms for programming a memory cell may be relied upon, such as by applying a revise bias or negative voltage to the drain terminal of a memory cell. A general form of such a circuit arrangement, 700, is illustrated in FIG. 7A, where a negative voltage generator 702 (e.g., a negative charge pump) supplies a sufficiently large reverse bias or negative voltage to cause injection. It is noted that the configuration illustrated in the circuit arrangement 700 may be used in conjunction with other programmer circuits described herein.

Figure 7B:
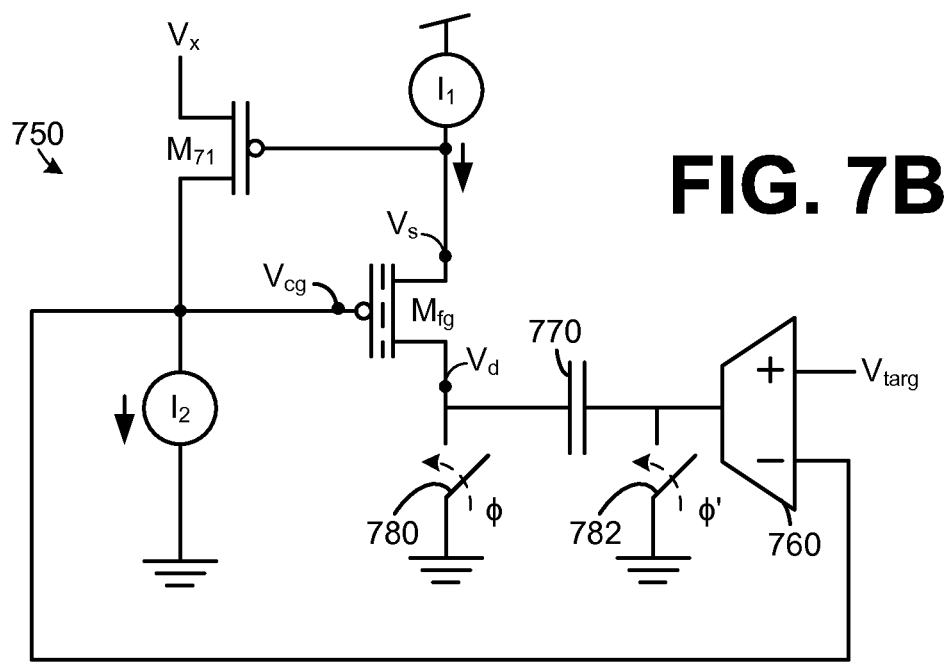
FIG. 7B illustrates an example embodiment of the memory cell circuit arrangement of FIG. 7A, according to an example embodiment.

FIG. 7B illustrates an example embodiment of the memory cell circuit arrangement of FIG. 7A, according to an example embodiment. The circuit arrangement 750 in FIG. 7B includes a floating gate transistor memory cell $M_{fg}$ having a source terminal, a drain terminal, and a gate terminal, a first current source $I_1$ coupled to the source terminal of the memory cell $M_{fg}$, a second current source $I_2$ coupled to the gate terminal of the memory cell $M_{fg}$, and a bias circuit (i.e., transistor $M_{71}$) coupled between a bias voltage $V_x$ and the gate terminal of the memory cell $M_{fg}$. The current sources $I_1$ and $I_2$ may be embodied by a single transistor or, in various embodiments, current mirrors and/or other circuitry, for example.

The circuit arrangement 750 further includes a negative voltage generator coupled to the drain terminal of the memory cell $M_{fg}$. The negative voltage generator comprises an OTA 760, a capacitor 770, and switches 780 and 782, arranged as illustrated. The OTA 760 includes a pair of differential input terminals. As illustrated, the inverting input of the OTA 760 is coupled to the gate terminal of the memory cell $M_{fg}$, and the non-inverting input of the OTA 760 is coupled to a target voltage $V_{targ}$ for programming the memory cell $M_{fg}$. The two switches 780 and 782 and the capacitor 770 form a negative charge pump.

In operation of the charge pump, the switches 780 and 782 may be operated to open and closed positions based on respective complimentary phases of a clock signal φ. While switch 780 is closed and switch 782 is open, the capacitor 770 is charged by the OTA 760, based on any difference between $V_{targ}$ and $V_{cg}$. Then when switch 780 opens and the switch 782 closes, the drain terminal of the memory cell $M_{fg}$ is pulled to a voltage below ground, and electrons are injected onto the FG of the memory cell $M_{fg}$. The feedback loop created by the negative voltage reduces charge on the capacitor 770, as the target programming is approached.

Figure 8:
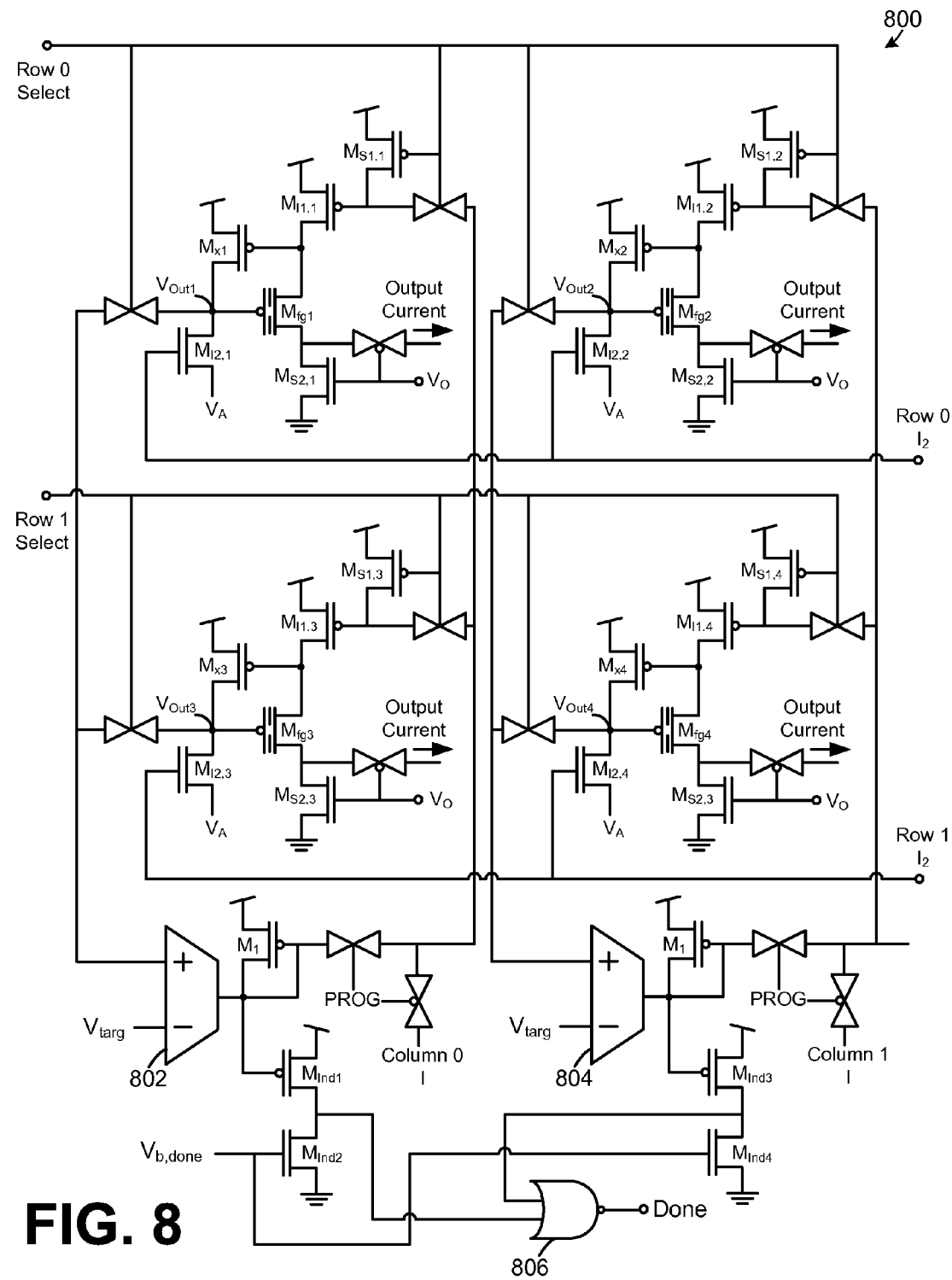
FIG. 8 illustrates an array of memory cells incorporating shared programming circuitry among the memory cells, according to an example embodiment.

As floating gate memory cells are used in memory arrays, the programming circuitry described herein should be applicable to a memory array. In that context, FIG. 8 illustrates an array 800 of memory cells $M_{fg1}$-$M_{fg4}$, arranged in rows and columns, incorporating shared programming circuitry among the memory cells, according to an example embodiment.

Programming circuitry in the array 800 includes an OTA for each column of the array. To program memory cells in the array 800, the programming circuitry is coupled to the array 800 by setting PROG to logic high. Particularly, row 0 memory cells $M_{fg1}$ and $M_{fg2}$ are selected by setting Row 0 Select to logic high, thus connecting the voltage outputs $V_{Out1}$ and $V_{Out\ 2}$ of the memory cells $M_{fg1}$ and $M_{fg2}$ to the OTAs 802 and 804, respectively. Also, by setting Row 0 Select to logic high, the control input of the current control transistors $M_{I1,1}$ and $M_{I1,2}$ are coupled to the outputs of the OTAs 802 and 804, respectively.

Alternatively, row 1 memory cells $M_{fg3}$ and $M_{fg4}$ are selected by setting Row 1 Select to logic high, thus connecting the voltage outputs $V_{Out3}$ and $V_{Out\ 4}$ of the memory cells $M_{fg3}$ and $M_{fg4}$ to the OTAs 802 and 804, respectively. Also, by setting Row 1 Select to logic high, the control input of the current control transistors $M_{I1,3}$ and $M_{I1,4}$ are coupled to the outputs of the OTAs 802 and 804, respectively.

To read from the array 800, $V_O$ is set to logic high, a row is selected by the Row 0 and Row 1 select inputs, and currents are selected at the Column 0 and Column 1 current bias inputs. For unselected rows, the gate terminals of the transistors $M_{I1}$ are pulled to the rail voltage $V_{dd}$ to prevent injection. In run or read mode, memory cells $M_{fg1}$-$M_{fg4}$ can be operated to provide either voltage outputs or current outputs, for reference. The current outputs are accessed by pulling $V_O$ to logic low so that the drain of a memory cell $M_{fg1}$-$M_{fg4}$ is coupled to its current output terminal, and by pulling the source terminal of the memory cell $M_{fg1}$-$M_{fg4}$ up to the rail voltage $V_{dd}$ by lowering the potential on the column current bias inputs. With the voltage at a source terminal of a memory cell $M_{fg1}$-$M_{fg4}$ at a high potential, the associated $M_x$ transistor is off, and the control gate (i.e., $V_{Out}$) of the memory cell is connected to $V_A$ by raising the associated $I_2$ bias row input.

In the array 800, memory cells can be programmed serially or in parallel. In the context of programming, the array 800 includes indicator circuitry. For the OTA 802, the indicator circuitry includes transistors $M_{Ind1}$ and $M_{Ind2}$. For the OTA 804, the indicator circuitry includes transistors $M_{Ind3}$ and $M_{Ind4}$. The indicator circuitry also includes the NOR gate 806. The done indicator provided by the output of the NOR gate 806 asserts a high voltage when all cells in a row have finished programming. That is, when a column finishes programming, the gate terminal of $M_{Ind1}$ or $M_{Ind3}$ is pulled up to $V_{dd}$ by one of the OTAs 802 or 804. This causes the drain of $M_{Ind1}$ or $M_{Ind3}$ to drop to ground, which is fed as a logic low input to the NOR 806 gate. When all columns have finished programming, all inputs to the NOR gate 806 are at logic low level, and the "Done" indicator is asserted at logic high.

Here, it is noted that circuit arrangement of the array 800 is provided by way of example, as other embodiments or arrangements are within the scope and spirit of the embodiments described herein. For example, the Row 0 $I_2$ and Row 1 $I_2$ biases may be coupled together rather than being separate. Also, the OTAs 802 and 804 may be coupled to a reference control input of one of a first current source (e.g., $M_{f1}$), a second current source (e.g., $M_{f2}$), or a bias circuit (e.g., $M_x$) of any of the memory cells $M_{fg1}$-$M_{fg4}$ in the array 800, as part of programming feedback, as suggested according to the various embodiments described herein. Also, it is noted that output voltages or currents from any of the memory cells $M_{fg1}$-$M_{fg4}$ may be used to bias analog circuits such as filter banks, classifiers, and field-programmable analog arrays, for example.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

At least the following is claimed:

1. A method, comprising:
providing, via a current source, channel current for a memory cell having a source terminal, a drain terminal, and a gate terminal, wherein the current source is coupled to the source terminal or the drain terminal of the memory cell; and
continuously programming the memory cell at an adaptive rate, based on a target voltage for programming, using a feedback loop to monitor the gate terminal of the memory cell and continuously adapting at least one of an amount of current that is supplied by the current source or the drain-to-source voltage of the memory cell set by a linearizing amplifier, wherein the linearizing amplifier sets a drain-to-source voltage of the memory cell using the feedback loop, from the source terminal or drain terminal of the memory cell, to the gate terminal of the memory cell, wherein the current source comprises a current mirror, circuitry for programming comprises an operational transconductance amplifier (OTA) having an output and a pair of differential inputs, the current mirror is coupled to the source terminal of the memory cell, the output of the OTA is coupled to a reference control input of the current mirror, and the differential inputs of the OTA are coupled to the gate of the memory cell and the target voltage for programming.

2. A method, comprising:
providing, via a current source, channel current for a memory cell having a source terminal, a drain terminal, and a gate terminal, wherein the current source is coupled to the source terminal or the drain terminal of the memory cell; and
continuously programming the memory cell at an adaptive rate, based on a target voltage for programming, using a feedback loop to monitor the gate terminal of the memory cell and continuously adapting at least one of an amount of current that is supplied by the current source or the drain-to-source voltage of the memory cell set by a linearizing amplifier, wherein the linearizing amplifier sets a drain-to-source voltage of the memory cell using the feedback loop, from the source terminal or drain terminal of the memory cell, to the gate terminal of the memory cell, wherein circuitry for programming comprises a differential amplifier having a pair of differential inputs and a diode-connected transistor load, wherein one input of the pair of differential inputs is coupled to the gate terminal of the memory cell, another input of the pair of differential inputs is coupled to the target voltage for programming, and an output of the differential amplifier is coupled to an input of the linearizing amplifier such that the drain-to-source voltage of the memory cell is adjusted during programming to adapt the program rate.

3. A method, comprising:
providing, via a current source, channel current for a memory cell having a source terminal, a drain terminal, and a gate terminal, wherein the current source is coupled to the source terminal or the drain terminal of the memory cell; and
continuously programming the memory cell at an adaptive rate, based on a target voltage for programming, using a feedback loop to monitor the gate terminal of the memory cell and continuously adapting at least one of an amount of current that is supplied by the current source or the drain-to-source voltage of the memory cell set by a linearizing amplifier, wherein the linearizing amplifier sets a drain-to-source voltage of the memory cell using the feedback loop, from the source terminal or drain terminal of the memory cell, to the gate terminal of the memory cell, wherein the current source is coupled to the source terminal of the memory cell, and a negative voltage generator is coupled to the drain terminal of the memory cell.

4. The method of claim 3, wherein the negative voltage generator comprises an operational transconductance amplifier (OTA), a capacitor, and at least two switches switched by complementary phases of a clock signal.

5. A method, comprising:
providing current, via a first current source coupled to a source terminal of a memory cell having the source terminal, a drain terminal, and a gate terminal;
providing current, via a second current source coupled to the gate terminal of the memory cell; and
continuously programming the memory cell at adaptive rate, based on a target voltage for programming, using a feedback loop between the gate terminal of the memory cell and either the first current source, the second current source, or a source terminal of a bias transistor with: a drain terminal of the bias transistor coupled to the gate terminal of the memory cell, a gate terminal of the bias transistor coupled to the source terminal of the memory cell, and the source terminal of the bias transistor coupled to a bias voltage.

6. The method of claim 5, wherein the first current source comprises a current mirror, the circuitry for programming comprises an operational transconductance amplifier (OTA), and an output of the OTA is coupled to a reference control input of the current mirror.

7. The memory cell circuit of claim 5, wherein the second current source comprises a current mirror; the circuitry for programming comprises an operational transconductance amplifier (OTA), and an output of the OTA is coupled to a reference control input of the current mirror.

8. The method of claim 5, wherein circuitry for programming comprises a differential amplifier having a pair of differential inputs and a diode-connected transistor load, wherein one input of the pair of differential inputs is coupled to the gate terminal of the memory cell; the other input of the differential inputs is coupled to the target voltage for programming; and an output of the differential amplifier is coupled to the source terminal of the bias transistor such that the source terminal of the memory is continuously adjusted during programming to adapt the program rate.

9. The method of claim 5, wherein a negative voltage generator is coupled to the drain terminal of the memory cell.

10. The method of claim 9, wherein the negative voltage generator comprises an operational transconductance amplifier (OTA), a capacitor, and at least two switches switched by complementary phases of a clock signal.

* * * * *